(12) United States Patent
Jammy et al.

(10) Patent No.: US 6,707,086 B1
(45) Date of Patent: Mar. 16, 2004

(54) METHOD FOR FORMING CRYSTALLINE SILICON NITRIDE

(75) Inventors: Rajarao Jammy, Wappingers Falls, NY (US); Philip L. Flaitz, Newburgh, NY (US); Philip E. Batson, Katonah, NY (US); Hua Shen, Beacon, NY (US); Yun Yu Wang, Poughquah, NY (US)

(73) Assignees: Infineon Technologies AG, Munich (DE); International Business Machines Corp., Armonk, NY (US)

(*) Notice: Subject to any disclaimer, the term of this patent is extended or adjusted under 35 U.S.C. 154(b) by 210 days.

(21) Appl. No.: 09/594,638

(22) Filed: Jun. 15, 2000

Related U.S. Application Data

(62) Division of application No. 09/363,523, filed on Jul. 29, 1999.

(51) Int. Cl.$^7$ .............................................. H01L 31/119
(52) U.S. Cl. .................... 257/296; 257/301; 257/309
(58) Field of Search ................................. 257/296, 301, 257/309; 438/775, 776, 906, 974

(56) References Cited

U.S. PATENT DOCUMENTS

| | | | |
|---|---|---|---|
| 5,643,823 A | * | 7/1997 | Ho et al. ..................... 437/67 |
| 6,100,132 A | * | 8/2000 | Sato et al. ................... 438/243 |
| 6,194,754 B1 | * | 2/2001 | Aggarval et al. ........... 257/295 |
| 6,495,876 B1 | * | 12/2002 | Bronner et al. ............. 257/305 |
| 2002/0137362 A1 | * | 9/2002 | Jammy et al. .............. 438/791 |

FOREIGN PATENT DOCUMENTS

EP 0684637 * 5/1995

* cited by examiner

*Primary Examiner*—Alexander Ghyka

(57) ABSTRACT

In accordance with the present invention, a method for forming a crystalline silicon nitride layer, includes the steps of providing a crystalline silicon substrate with an exposed surface, precleaning the exposed surface by employing a hydrogen prebake and exposing the exposed surface to nitrogen to form a crystalline silicon nitride layer. Also, a trench capacitor, in accordance with the present invention, includes a crystalline silicon substrate including deep trenches having surface substantially free of native oxide. A dielectric stack, including a crystalline silicon nitride layer, is formed on the sidewalls of the trenches. The dielectric stack forms a node dielectric between electrodes of the trench capacitor.

12 Claims, 5 Drawing Sheets

METHOD FOR FORMING CRYSTALLINE SILICON NITRIDE

This is a divisional, of application Ser. No. 09/363,523 filed on Jul. 29, 1999.

BACKGROUND

1. Technical Field

This disclosure relates to semiconductor fabrication and more particularly, to a method for forming crystalline silicon nitride dielectric layers for semiconductor devices.

2. Description of the Related Art

Silicon nitride is used extensively in microelectronic technology for its superior dielectric properties. Typically, silicon nitride includes superior dielectric constant (e.g., $\in=7.5$ for silicon nitride) as compared to silicon dioxide (e.g., $\in=3.9$). The need for higher capacitance with shrinking dimensions in semiconductor devices such as dynamic random access memories (DRAMs) has been met by reducing the thickness of dielectric layers. Much of the silicon nitride employed for microelectronic applications is deposited by Chemical Vapor Deposition (CVD) techniques and is amorphous in structure. Although thick amorphous silicon nitride ($Si_3N_4$) films have adequately low leakage currents, for thin (<50 Å) dielectric films, higher leakage currents impede, if not preclude, successful device implementation.

To overcome the limitations posed by excessive leakage currents observed in thin CVD nitride dielectric layers, a thermally grown $Si_3N_4$ component is added to the CVD nitride layer. Thermally grown $Si_3N_4$ is denser than CVD silicon nitride and exhibits superior electrical properties for the same thickness. However, thermal growth of silicon nitride is a self limiting process (at about 950° C. approximate thickness of nitride layer is 18–23 Å which is limited by the thermal growth process). To meet the total required thickness, a CVD nitride layer may be added to the initial thermal nitride.

For DRAM chips employing deep trench capacitors, a node dielectric is deposited in a deep trench. The node dielectric separates the storage node in the deep trench from a buried plate outside the trench to form a capacitor. It is desirable for the node dielectric to be as thin as possible to provide a high capacitance with minimal or low leakage. Node dielectrics have evolved from using an oxide only (O) dielectric layer to a mixed oxide-nitride (ONO) and currently to nitride-oxide (NO) dielectric layers to take advantage of the higher $\in$ of $Si_3N_4$. Similarly, for gate dielectrics, in addition to a reduction in thickness, incorporation of some nitride into the oxide film is being explored to boost the physical thickness (and dielectric constant) while keeping the equivalent oxide thickness small enough to meet the needs of smaller and faster devices.

A desirable option for improving the properties of ultrathin dielectric layers would be to employ crystalline $Si_3N_4$ films for such applications. Unlike CVD nitride films, in which the large leakage currents have been attributed to the presence of a large number of defects and pinholes, crystalline nitride films by nature could be denser and relatively defect free. However, crystalline $Si_3N_4$ films are difficult to grow and unstable due to lattice mismatch with silicon and the consequent excessive strain at the growth interface. An added complication for the case of a node dielectric is the presence of a thin non-stoichiometric native oxide on the exposed silicon surface of a substrate which inhibits the reaction between nitridizing species and the silicon substrate. This native oxide may be partially responsible for the electrical leakage in thermally grown nitride films.

Therefore, a need exists for a method to preclean and remove a native oxide before thermal nitridation of exposed silicon is performed. A further need exists for a method for forming a crystalline silicon nitride for semiconductor devices.

SUMMARY OF THE INVENTION

In accordance with the present invention, a method for forming a crystalline silicon nitride layer, includes the steps of providing a crystalline silicon substrate with an exposed silicon surface, precleaning the exposed surface by annealing in a hydrogen ambient and further annealing or exposing the exposed surface to nitrogen (e.g. in an ammonia ambient) to form a crystalline silicon nitride layer.

A method for forming a node dielectric layer in deep trenches, includes the steps of providing a crystalline silicon substrate with trenches formed therein, the trenches including surfaces with exposed silicon, precleaning the exposed silicon surfaces by employing a hydrogen prebake, exposing the exposed surfaces to ammonia to form a crystalline silicon nitride layer, depositing an amorphous silicon nitride layer over the crystalline silicon nitride layer, and oxidizing the amorphous silicon nitride layer to form a node (NO) dielectric layer.

In alternate methods, the step of precleaning may include the step of employing a wet cleaning process to remove native oxide from the exposed surface(s). The cleaning process may include HF cleaning. The step of precleaning may include the step of prebaking the exposed surface(s), in situ, in the presence of hydrogen gas, hydrogen plasma or similar reducing atmospheres at a temperature between about 400° C. and about 1300° C. at a pressure between about $10^{-9}$ Torr and about 600 Torr. The step of precleaning may include the step of prebaking the exposed surface(s) in the presence of hydrogen gas introduced at a flow rate of between about 100 sccm and about 20 SLM for between about 2 seconds and about 3600 seconds. Flow rates and time durations can vary over a wide range of acceptable values depending on the conditions and the tool set employed. The step of annealing/exposing the exposed surface(s) to nitrogen to form a crystalline silicon nitride layer may include the step of introducing ammonia at a temperature of between about 400° C. and about 1300° C. The step of exposing the exposed surface(s) to nitrogen to form a crystalline silicon nitride layer may include the step of maintaining ammonia at a pressure of between about $10^{-6}$ Torr and about one atmosphere or greater. A semiconductor device may be fabricated in accordance with the methods described herein.

A trench capacitor, in accordance with the present invention, includes a crystalline silicon substrate including deep trenches having surfaces substantially free of native oxide. A dielectric stack, including a crystalline silicon nitride layer, is formed on the surfaces of the trenches. The dielectric stack forms a node dielectric between electrodes of the trench capacitor.

In alternate embodiments, the crystalline silicon nitride layer may include a thickness of between about 3 Å and about 40 Å. The dielectric stack may include an oxidized amorphous nitride layer.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to semiconductor fabrication and more particularly, to a method for forming crystalline silicon nitride dielectric layers for semiconductor devices. Silicon nitride, and preferably stoichiometric $Si_3N_4$, is an important dielectric material for many microelectronic applications needing a high dielectric constant ($\in$) with low leakage currents. Much of the silicon nitride used for such applications is amorphous and is typically a combination of both thermally grown (in $N_2$ or $NH_3$) and/or deposited (by LPCVD techniques) materials. Although desirable for their enhanced properties, crystalline silicon nitride films are difficult to grow due to lattice mismatch and off-stoichiometric growth kinetics. The present invention includes a method for forming a crystalline silicon nitride layer. In a preferred embodiment the present invention is illustratively described for the formation of a node dielectric in deep trenches for deep trench capacitors. Other applications are contemplated as well. A preclean process is desirable prior to the formation of the crystalline silicon nitride layer.

Figure 1:
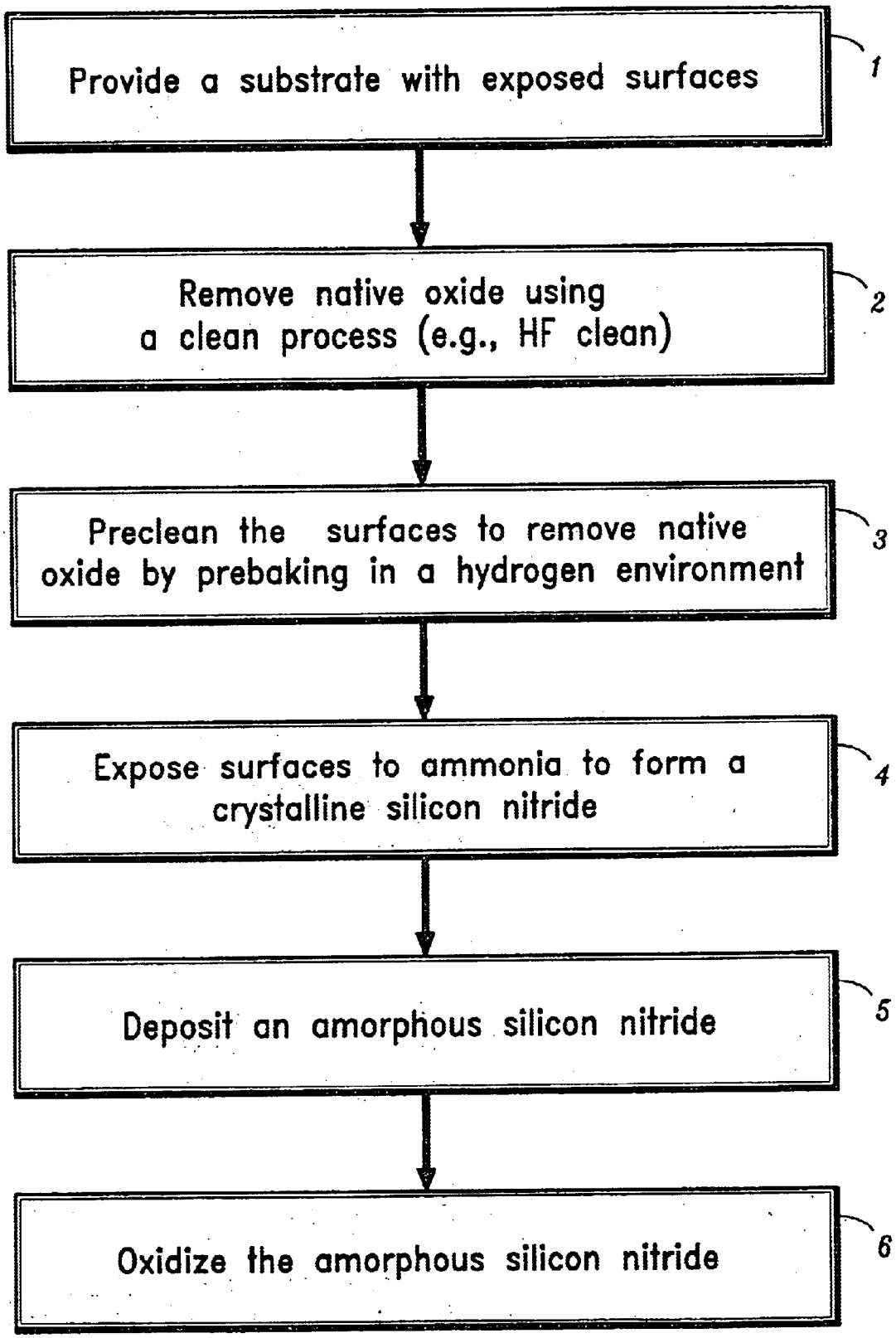
FIG. 1 is a flow diagram showing a method for forming a crystalline silicon nitride layer in accordance with the present invention.
Figure 2:
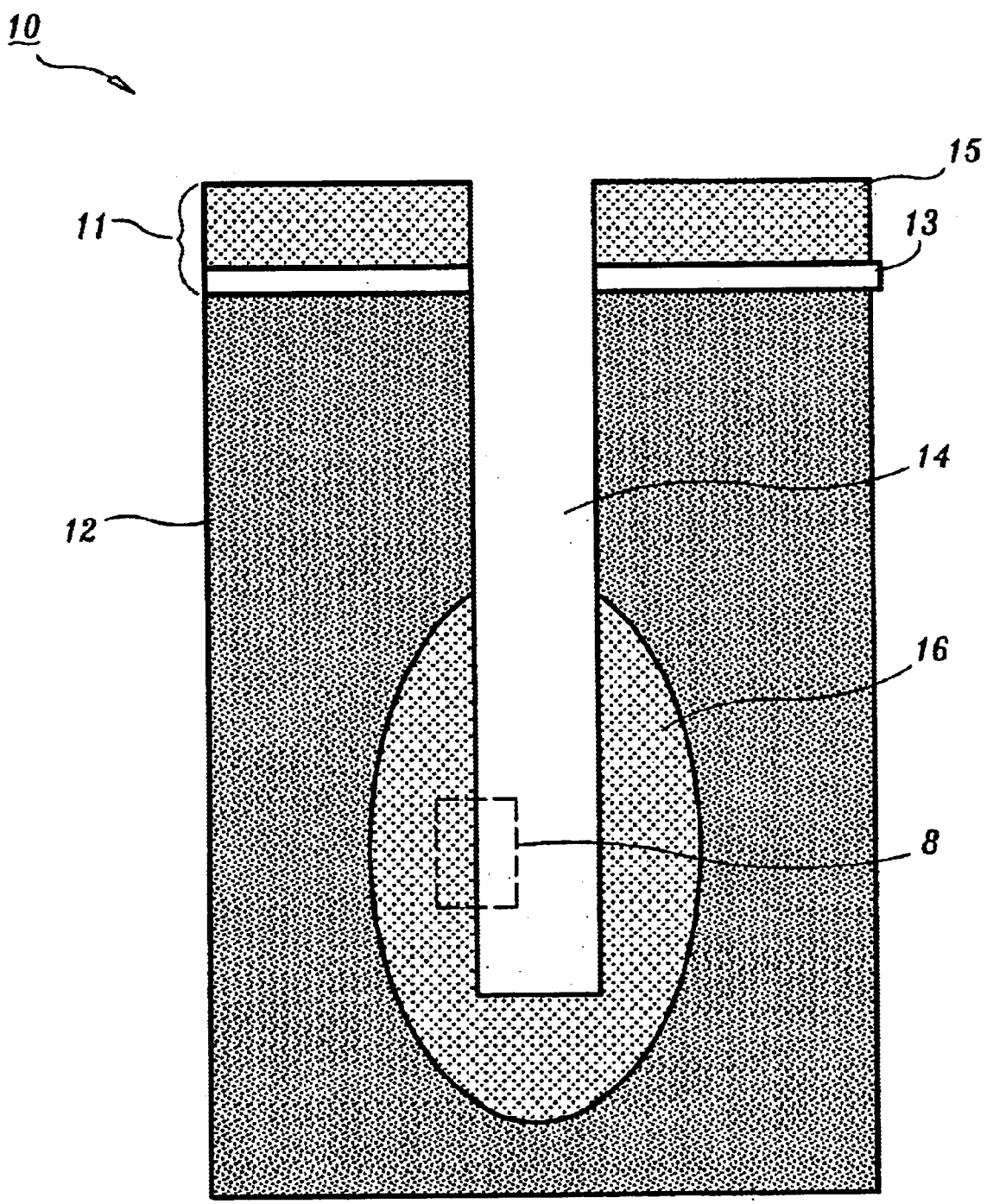
FIG. 2 is a cross-sectional view of a trench formed in a silicon substrate for forming a silicon nitride crystalline layer in accordance with the present invention.

Referring now in specific detail to the drawings in which like reference numerals identify similar or identical elements throughout the several views, and initially to FIGS. 1 and 2, a flow diagram for a method in accordance with the invention (FIG. 1) and a cross-sectional view of a semiconductor chip 10 (FIG. 2) are shown. Semiconductor chip 10 may include a memory device such as, a dynamic random access memory (DRAM), a synchronous DRAM (SDRAM), static RAM or other memory device. It is to be understood that the present invention is not limited to semiconductor memories. The invention may be practiced for semiconductor chips which may include processors, embedded DRAM or other embedded memory devices, application specific integrated circuit chips (ASIC) or any other devices which employ dielectric films.

Semiconductor chip 10 of FIG. 2, illustratively shows a semiconductor memory having deep trench capacitor technology. In block 1, a semiconductor chip 10 is provided. Semiconductor chip 10 includes a substrate 12 which may be a monocrystalline silicon substrate, however, other silicon based/modified materials may be employed, for example, silicon on insulator, epitaxially grown silicon, etc. A pad stack 11 is formed on substrate 12. Pad stack 11 preferably includes a thermal oxide layer 13 and a pad nitride layer 15. Deep trenches 14 have been formed in substrate 12 by methods known to those skilled in the art. A buried plate 16 is also formed by conventional methods. These methods may include depositing arsenic silicate glass (ASG) in the trench as a dopant source and diffusing dopants into substrate 12. Alternate techniques may include employing ion bombardment or gas phase doping to form buried plate 16.

Prior to further processing, it is preferable to preclean exposed surfaces of substrate 12, i.e., trench sidewalls, to remove native oxides which may form on the surface of substrate 12. In block 2, a standard cleaning process is performed to remove the native oxide on the trench sidewalls and exposed surfaces. The cleaning process may include a wet cleaning process, such as, a HF clean or other cleaning processes known in the art, such as, a RCA/B clean. Combinations of cleaning processes may also be employed. The wafers or chips 10 are then transferred to the reaction chamber for further processing. The reaction chamber in which processing occurs is then evacuated if the transfer is not done, in situ, under vacuum.

In block 3, a hydrogen ($H_2$) preclean is performed on the exposed silicon surface of the trench sidewalls after the evacuation of the reaction chamber. This step further removes the native oxide from the silicon surface of substrate 12 at sidewalls of trench 14. The efficacy of the clean process depends on the temperature, time, gas flow and pressure. In a preferred method, the gas flow may include a flow rate of about 100 sccm and about 10 SLM for between about 2 seconds and about 3600 seconds. Flow rates and time durations can vary over a wide range of acceptable values depending on the conditions and the tool set employed. The step of precleaning may include the step of prebaking exposed silicon surface(s), in situ, in the presence of hydrogen gas, hydrogen plasma or similar reducing atmospheres at a temperature between about 400° C. and about 1300° and at a pressure between about $10^{-9}$ Torr and about 600 Torr.

Figure 3:
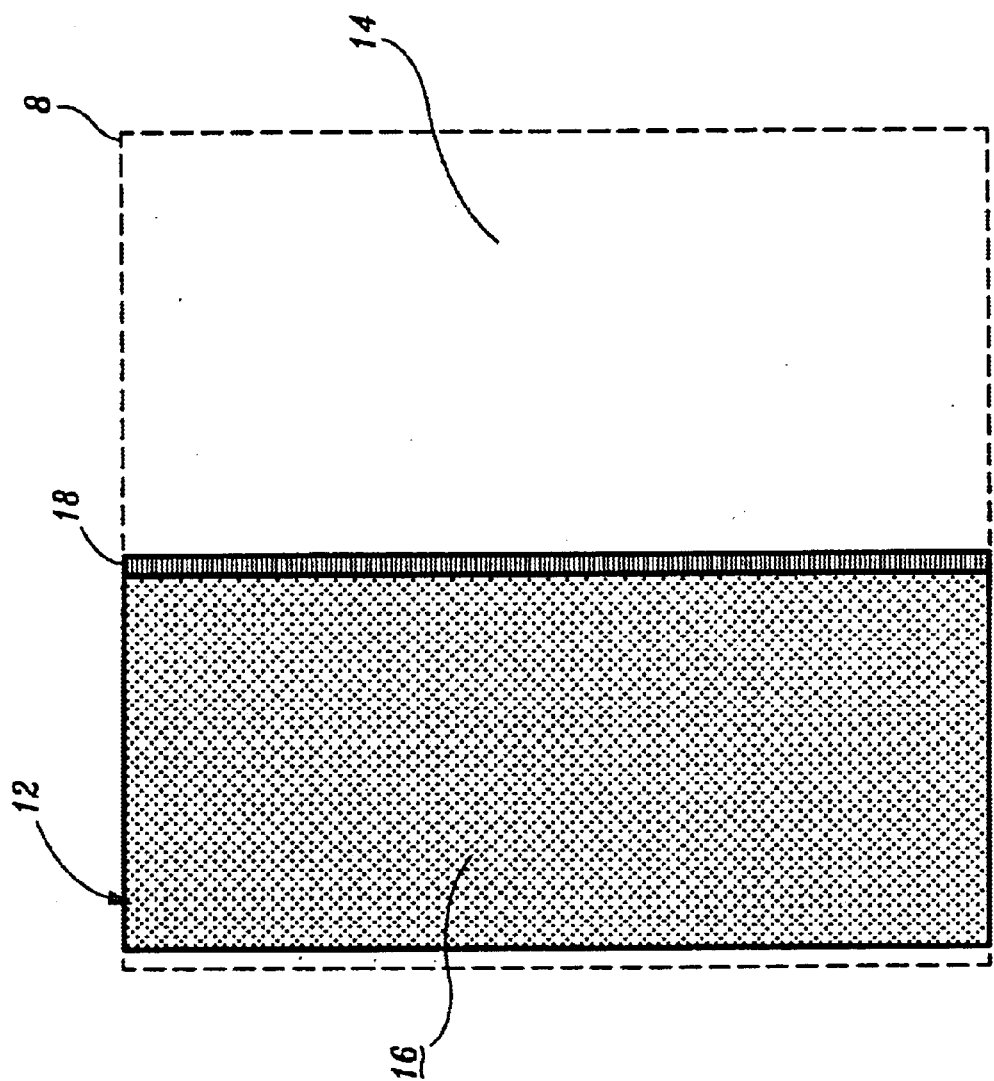
FIG. 3 is a magnified cross-sectional view of area 8 of FIG. 2 showing a crystalline silicon nitride layer formed in accordance with the present invention.
Figure 4:
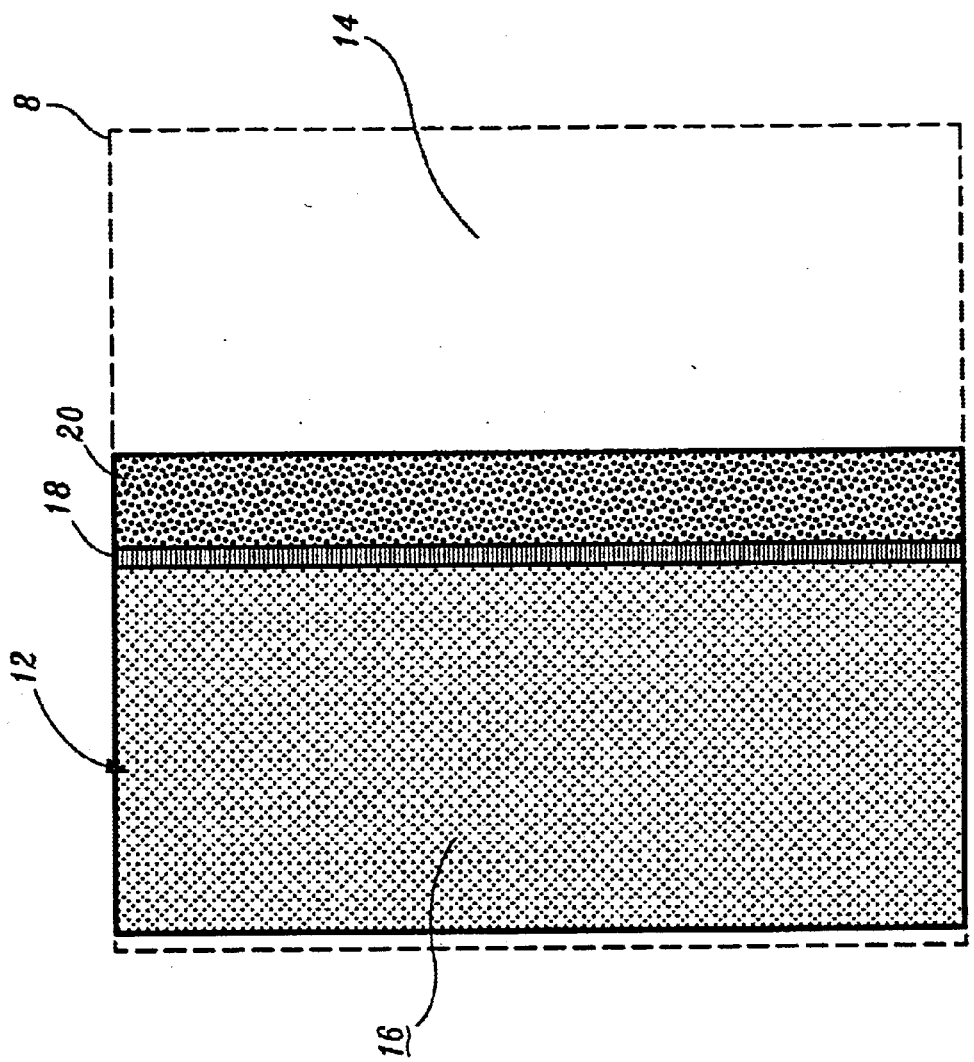
FIG. 4 is a cross-sectional view of the area 8 of FIG. 3 showing an additional silicon nitride layer formed in accordance with the present invention.
Figure 5:
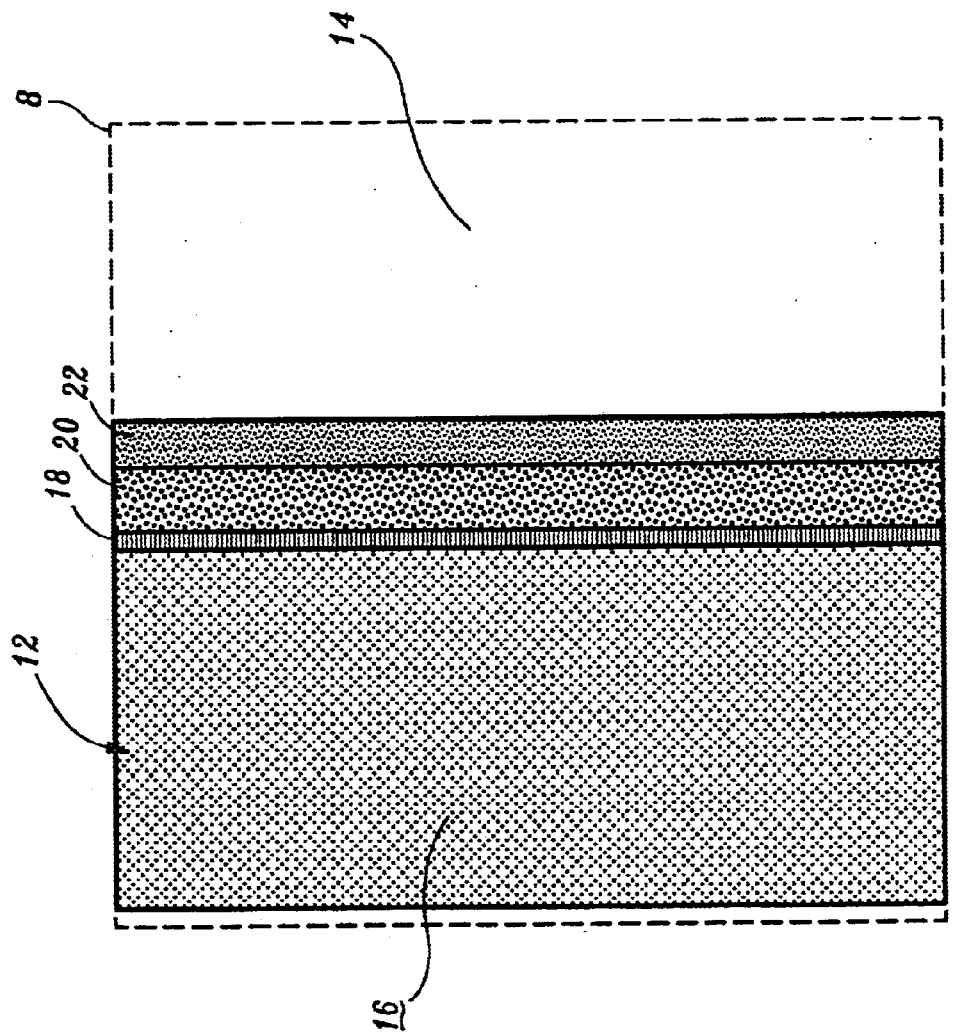
FIG. 5 is a cross-sectional view of the area 8 of FIG. 4 showing an oxidized silicon nitride layer formed in accordance with the present invention.

FIG. 2 indicates an area of interest 8 which is magnified in FIGS. 3, 4 and 5 to show the process step of the method of the present invention.

Referring to FIG. 3, with continued reference to FIG. 1, after evacuating the reaction chamber of any $H_2$ (typical but not necessary), the silicon surface of substrate 12 is exposed to nitrogen containing compounds, preferably ammonia ($NH_3$) or $N_2$ gas, in block 4. For convenience, the process will be illustratively described using ammonia. The nitrogen may be introduced with other materials or compounds, for example, $N_2$ gas, atomic nitrogen formed by plasma techniques or nitrogen containing organic or inorganic precursors. Ammonia is preferably introduced into the reaction chamber at a temperature of between about 400° C. and about 1300° C., preferably between about 900° C. and about 1100° C. The pressure maintained in the chamber during the introduction of the ammonia is between about $10^{-6}$ Torr and about one atmosphere or greater, preferably between about 1 Torr and about 600 Torr. The thickness of a nitride layer 18 formed during this step is largely dependent on the temperature and to a lesser extent on the pressure. In a preferred embodiment, a thickness of nitride layer 18 is between about 3 Å to about 40 Å. Nitride layer 18 forms a crystalline silicon nitride layer.

The crystalline characteristics of this nitride layer 18 have been confirmed by tests and analysis. For example, a substantially continuous crystalline silicon nitride layer was observed along the trench sidewalls of a semiconductor device. Nitride layer 18 exhibited characteristics indicative of a crystalline layer and was uniformly oriented parallel to the silicon in the sidewalls of the trench. Measurement of the lattice planes of nitride layer 18 resulted in a measured spacing of approximately 4 Å, which is a close match to the theoretical spacing of 3.88 Å for the (110) planes of hexagonal $Si_3N_4$.

Nitride layer 18 may include a thickness of between 2–6 atomic layers. In addition, analysis on a Scanning Transmission Electron Microscope (STEM) with a 2–3 Å lateral resolution and Electron Energy Loss Spectroscopy (EELS) with an energy resolution of 0.35 eV confirmed that the layer was crystalline silicon nitride and oxide at the silicon to silicon nitride interface was absent. The crystalline silicon nitride layer was not observed when the sample was not subjected to in situ $H_2$ pre-bake and $NH_3$ nitridation in accordance with the present invention.

The $H_2$ pre-bake, in block 3, results in a thicker nitride layer 18. Depending on the growth conditions (i.e, crystal directions of the surface on which the film is to be grown), the pressure of the $H_2$ pre-bake (block 3) and the time between the cleaning (block 2) and $H_2$ pre-bake (block 3) three distinct types of nitride films may result. The three distinct types of nitride films are illustratively described in terms of specifics. These specifics are not to be construed as limiting as other parameters may be employed in accordance with the invention to achieve similar results. The three distinct types of nitride films that may result include:

a) a continuous crystalline layer which is formed if the pressure is about 5 Torr and the amount of time between the cleaning process and the $H_2$ pre-bake is between less than about 30 seconds and about 1 hour;

b) a floating (partial) crystalline layer is formed if the pressure is below about 5 Torr and the amount of time between the cleaning process and the $H_2$ pre-bake is between more than about 1 hour; and c) an amorphous layer is formed outside the parameters of a) and b).

Advantageously, this provides the ability to modulate silicon nitride layer 18 by varying the process conditions. Other process parameters and tool settings may be used as well.

Referring to FIG. 4 with continued reference to FIG. 1, an additional silicon nitride layer 20 may be deposited by a chemical vapor deposition (CVD) process or a physical vapor deposition process in block 5, to obtain a desired thickness of a total dielectric layer. The total dielectric layer thickness is comprised of nitride layer 18 and nitride layer 20.

Referring to FIG. 5 with continued reference to FIG. 1, an additional step may be performed to make the total dielectric layer compatible with later processes. Nitride layers 18 and 20 may be exposed to an oxidizing ambient at suitable temperatures to form an oxidized portion of nitride layer 20 thereby forming an N—O stack. Processing then continues as is known in the art. A storage node is formed in trench by filling the trench with polysilicon. The storage node (not shown) and buried plate 16 act as capacitor electrodes for which the N—O stack is the capacitor or node dielectric.

Although described in terms of a deep trench capacitor, the present invention may be applied to other semiconductor structures and devices. For example, the crystalline silicon nitride layer may be employed instead of a gate oxide for vertical transistors. Other applications are contemplated as well. Local nitride crystallization may also be formed by employing the above methods in accordance with the present invention. For example, localized nitride crystals may be formed on polycrystalline silicon surfaces to provide a dielectric layer thereon. This embodiment may be employed for forming devices in flash memories, for example, or other devices employing polysilicon.

Having described preferred embodiments for a method for forming crystalline silicon nitride (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by letters patent is set forth in the appended claims.

What is claimed is:

1. A trench capacitor comprising:
   a crystalline silicon substrate including deep trenches having hydrogen baked surfaces in the substrate that are substantially free of native oxide; and
   a dielectric stack, including a continuous monocrystalline silicon nitride layer, formed on the hydrogen baked surfaces of the trenches, the dielectric stack for forming a node dielectric between electrodes of the trench capacitor.

2. The trench capacitor as recited in claim 1, wherein the crystalline silicon nitride layer includes a thickness of between about 3 Å and about 40 Å.

3. The trench capacitor as recited in claim 1, wherein the dielectric stack includes an oxidized amorphous nitride layer.

4. The trench capacitor as recited in claim 1, wherein the crystalline nitride layer is between 2 and 6 atoms thick.

5. The trench capacitor as recited in claim 1, wherein the crystalline nitride layer includes stoichiometric $Si_3N_4$.

6. A trench capacitor comprising:
   a crystalline silicon substrate including a trench having a surface formed in the substrate, the surface being hydrogen baked to be substantially free of native oxide;
   a continuous monocrystalline silicon nitride layer, formed on the hydrogen baked surface of the trench; and
   an amorphous silicon nitride layer formed on the crystalline silicon nitride layer, the crystalline silicon nitride layer and the amorphous silicon nitride layer for forming a dielectric between electrodes.

7. The trench capacitor as recited in claim 6, wherein the crystalline silicon nitride layer includes a thickness of between about 3 Å and about 40 Å.

8. The trench capacitor as recited in claim 6, wherein the amorphous nitride layer is oxidized.

9. The trench capacitor as recited in claim 6, wherein the crystalline nitride layer is between 2 and 6 atoms thick.

10. The trench capacitor as recited in claim 6, wherein the crystalline nitride layer includes stoichiometric $Si_3N_4$.

11. The trench capacitor as recited in claim 6, wherein the electrodes includes a storage node and a buried plate.

12. The trench capacitor as recited in claim 6, wherein the crystalline nitride layer provides a gate dielectric layer.

* * * * *